United States Patent [19]

Morris

[11] Patent Number: 5,315,553
[45] Date of Patent: May 24, 1994

[54] MEMORY CIRCUIT TEST SYSTEM USING SEPARATE ROM HAVING TEST VALUES STORED THEREIN

[75] Inventor: John O. Morris, Houston, Tex.

[73] Assignee: Texas Instruments Incorporated, Dallas, Tex.

[21] Appl. No.: 712,793

[22] Filed: Jun. 10, 1991

[51] Int. Cl.⁵ .............................................. G11C 7/00
[52] U.S. Cl. ................................. 365/201; 371/21.1
[58] Field of Search ................. 365/201; 371/21.1, 52

[56] References Cited

U.S. PATENT DOCUMENTS

| | | | |
|---|---|---|---|
| 4,429,388 | 1/1984 | Fukushima et al. | 365/201 X |
| 4,862,418 | 8/1989 | Cuppens et al. | 371/21.1 X |
| 5,031,152 | 7/1991 | Doyle | 371/21.1 X |

FOREIGN PATENT DOCUMENTS

| | | | |
|---|---|---|---|
| 214500 | 10/1985 | Japan | 365/201 |
| 102095 | 5/1988 | Japan | 365/201 |
| 100799 | 4/1989 | Japan | 371/21.1 |
| 143984 | 6/1990 | Japan | 365/201 |

*Primary Examiner*—Benny Lee
*Attorney, Agent, or Firm*—Scott B. Stahl; James C. Kesterson; Richard L. Donaldson

[57] ABSTRACT

A memory test method and system are described which comprises a first memory array and a second memory array coupled to a plurality of row address lines within a memory system. During the testing of the memory system, row decode logic is used to sequentially access each of the row address lines The second memory array stores a predetermined value associated with each of the row address lines. Accordingly, accuracy of the row decode logic and continuity of the row address lines can be verified without the necessity of programming each memory location within the first memory array.

14 Claims, 1 Drawing Sheet

5,315,553

MEMORY CIRCUIT TEST SYSTEM USING SEPARATE ROM HAVING TEST VALUES STORED THEREIN

TECHNICAL FIELD OF THE INVENTION

This invention relates in general to the field of electronic devices and more particularly to an improved method and system for testing memory circuits.

BACKGROUND OF THE INVENTION

The ease with which an integrated electronic circuit is tested is one of the most important concerns in designing such electronic systems. In order to maximize the speed in which a system may be constructed and thereby reduce the cost of the system, systems must be designed so that they may be quickly and efficiently tested. Systems that require long time periods for testing have correspondingly lower throughput and thereby higher cost. Memory circuits provide one of the most important components of integrated electronic systems. The large amounts of memory which are present in modern electronic systems create a proportionally large problem for testing such devices. Each location within the memory system must be addressed to ensure that the address-decoding logic and the conducting path leading to each location are properly functioning.

A particular problem arises when the memory circuit to be tested is a non-volatile programmable memory circuit. Such circuits are very useful in integrated systems because they can have data programmed into them and written from them, but do not require the data refreshing operations which are common with many random access memory systems which use capacitive storage elements. Additionally, non-volatile memory systems have the ability to maintain the integrity of stored data when power is removed from the system. The drawback to many of such non-volatile systems is that the time required to write data to the systems is relatively large. Accordingly, the process of testing the address-decoding logic is considerably slowed by this programming time.

Accordingly, a need has arisen for a memory testing method and system which allows for the efficient and rapid testing of the address-decoding logic present within a memory system that is not slowed by the relatively long programming times required for some memory systems.

SUMMARY OF THE INVENTION

In accordance with the preferred embodiment, a memory circuit testing system is provided which substantially eliminates or reduces disadvantages and problems associated with prior memory testing systems. The memory testing system of the present invention comprises a first memory array and a second memory array which are each coupled to row address lines. The row address lines couple the first and second memory arrays to row decode address logic. Independent access to each row address line can be verified by accessing predetermined values stored in the second memory array.

An important technical advantage of the present invention is that it allows for dramatic savings in the amount of time required to test a memory system.

BRIEF DESCRIPTION OF THE DRAWINGS

For a more complete understanding of the present invention and the advantages thereof, reference is now made to the following description taken in conjunction with the accompanying drawings, wherein.

DETAILED DESCRIPTION OF THE INVENTION

Figure 1:
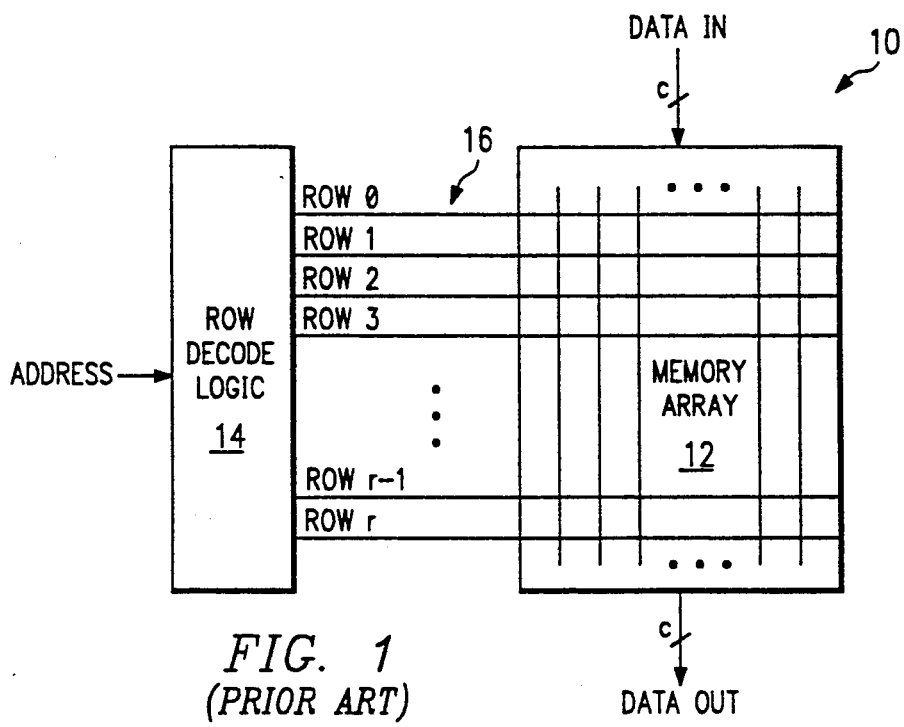
FIG. 1 is a schematic illustration of a prior memory system.

FIG. 1 is a schematic illustration of a prior art memory system which will be used to describe prior art methods of testing memory systems. FIG. 1 illustrates a memory circuit 10 which comprises a memory array 12 coupled to row decode logic 14 through a plurality of row lines Row 0, Row 1, Row 2, Row 3, ... Row r-1, and Row r indicated generally at 16. Memory array 12 comprises a matrix of memory locations having r rows and c columns. The c columns of memory array 12 are shown in FIG. 1 to be coupled to a DATA IN signal for input of data values and DATA OUT for output of data values. Memory array 12 is intended to represent a wide variety of memory storage systems. In some systems, a single data bus is coupled to the memory array through bidirectional data lines using known methods. The DATA IN and DATA OUT signals are illustrated herein to aid in teaching important technical advantages of the preferred embodiment and should not be construed to limit the scope of the present invention to any particular memory architecture.

The row decode logic 14 receives address signals from an ADDRESS bus. Using known methods, the ADDRESS signals are decoded, activating a single one of row lines 16. According to the known operation of memory systems, once a single one of the row lines 16 is activated, data may either be written to the memory locations contained within that row using the DATA IN signals or data stored at memory locations within the selected row may be read using the DATA OUT signals.

Prior to commercial operation of a device comprising memory system 10, the row decode logic 14 and the continuity of the row lines 16 must be tested. The most common method of testing these elements comprises a "data=address" test methodology. This test methodology proceeds by first programming unique values into each row of data locations and then sequentially accessing each row line. When a particular row is accessed during the "write" phase of the test, the numeric value corresponding to the address for that row is loaded into the data locations addressed by that row. For example, when row "3" is accessed during the "write" phase of the test methodology, the memory locations within row "3" of memory array 12 would be programmed to store the numeric value "3". The data from row "3" is then read out through the DATA OUT signals during the "read" phase of the test methodology and checked to make sure that a "3" was stored. This process is repeated for each row and takes a relatively long period of time to complete. For example, for a particular non-volatile memory array 12 comprising 256 row and 16 columns, this test procedure would result in 256 combined program and read operations. The problem with this test methodology is that for non-volatile memory arrays, the time required to program each memory location is very long in comparison to the time required to read data from each memory location. For example, a typical non-volatile memory array might require ten milliseconds to program a memory location and one microsecond to read data from a memory location. Using the example described previously, the test methodology would require 256 program operations and 256 read operations, resulting in a total time of 2.56 seconds to test the 256×16 memory array.

It should be understood that the example given above is merely for the purposes of teaching the problems associated with prior art testing methodologies and should not be construed to limit the present invention to any particular memory system. The problems identified are attendant with any memory system which has a large programming time and contains a large number of memory storage locations.

Figure 2:
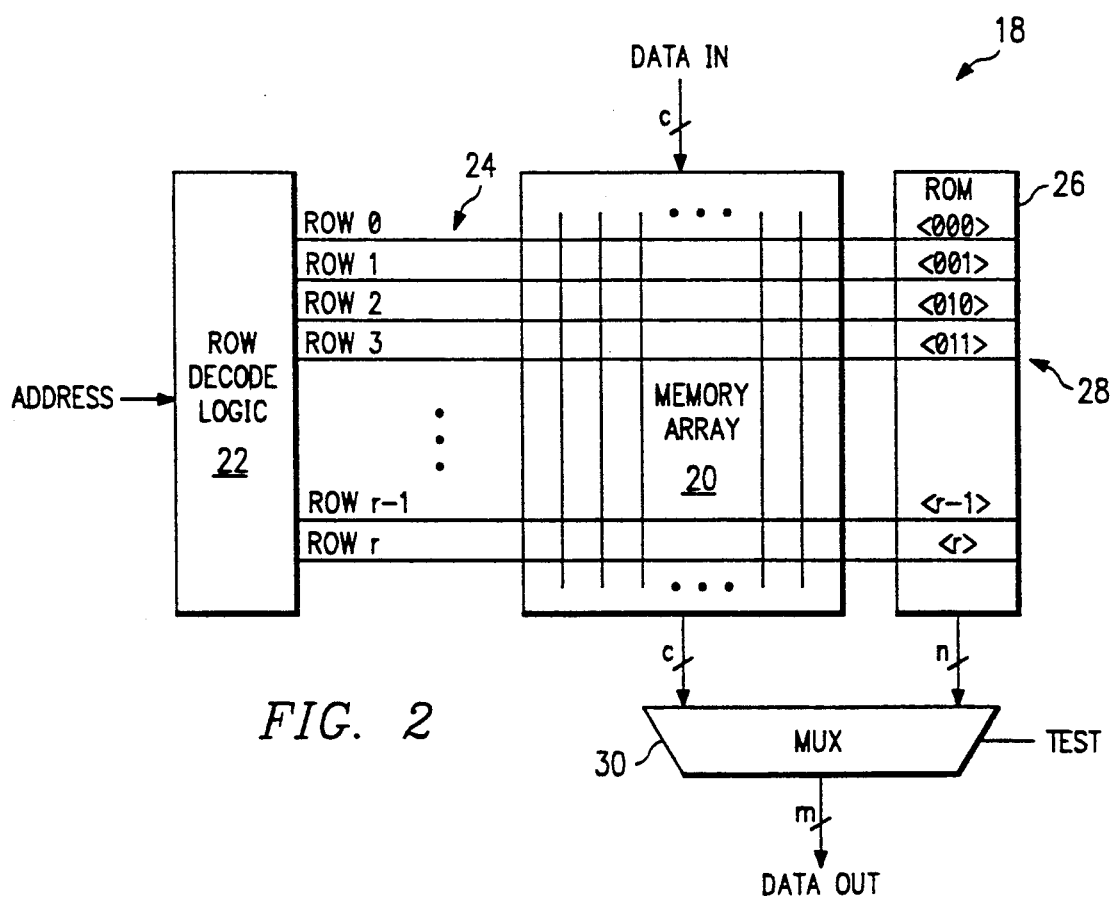
FIG. 2 is a schematic illustration of a memory circuit test system constructed according to the teachings of the present invention.

FIG. 2 is a schematic illustration of a memory system 18 constructed according to the teachings of the preferred embodiment. Memory system 18 comprises a memory array 20 which, for purposes of description of the preferred embodiment, may be assumed to be identical to memory array 12 described previously, and with some identically labeled elements that have already ben described above. Similarly, memory system 18 comprises a row decode lo 22 which may be assumed to be identical to row decode logic 14 described with reference to FIG. 1. Row decode logic receives ADDRESS signals from an address bus and decodes those ADDRESS signals to activate one of a plurality of row lines Row 0, Row 1, Row 2, Row 3, . . . Row r-1, and Row r indicated generally at 24. The interaction of memory array 20 and row decode logic 22 through row lines 24 is substantially identical to the operation of memory system 10 described previously with reference to FIG. 1.

The method of testing the row decode logic 22 and memory array 20 using the teaching of the preferred embodiment is accomplished by adding a read-only memory 26 coupled to each of the row lines 24. Read-only memory 26 contains r banks of storage locations. Each of the r banks are n bits in width where $r=2^n$ such that there are sufficient number of bits stored in each row of read-only memory 26 to encode the unique values associated with each of the rows r. According to one embodiment, the storage locations within read-only memory 26 are constructed to permanently contain the numeric value (<000>, <001>, <010>, <011>, . . . <r-1>, and <r>) associated with each of the rows connected to the read only memory 26. For example, the storage location indicated generally at 28 within read-only memory 26 which is coupled to row "3" contains the binary representation of the number "3" using n bits of storage space.

C bits are output from the memory array 20 and n bits are output from the read-only memory 26 into a multiplexer 30. The multiplexer utilizes a TEST signal to select between the input from the memory array 20 and the read-only memory 26. The selected set of signals is output from multiplexer 30 as the DATA OUT signal. The DATA OUT signal comprises m bits where m is greater than or equal to the greater of c or n such that the DATA OUT signal may communicate values from both the memory array 20 and read-only memory 26.

In operation, the test signal is used to select the data output from the read-only memory 26 during the testing of the row decode logic 22 and the memory array 20. As the rows within row lines 24 are sequentially accessed, the read-only memory 26 outputs the numeric representation of each, row from read-only memory 26 through multiplexer 30 into the DATA OUT signal. In this manner, the accurate addressing and decoding of each row is tested without the necessity of programming the memory locations within memory array 20. Without the programming time slowing the testing process, the testing of the row addressing capability of a particular memory system can be accomplished in on the order 0.01 percent of the time it would take if programming of each memory location was required. This tremendous reduction is due to the fact that only the time required to read data from the read-only memory 26 is required to accurately assess whether each row has been addressed during the sequential access of the row lines 24 during the test procedure.

During normal operation of memory system 18, the TEST signal causes the multiplexer 30 to select the output received from memory array 20 and pass the data directly to the DATA OUT signal. As such, during normal operation, the additional circuitry for purposes of performing the test methodology of the preferred embodiment does not substantially affect the access to the memory array 20.

Read-only memory 26 and multiplexer 30 are extremely compact structures when compared to the surface area required to implement the row decode logic 22 and the memory array 20. Accordingly, reduction in testing time on the order of 99.99 percent is accomplished by dedicating a very small amount of semiconductor surface area to the implementation of the read-only memory 26 and the multiplexer 30.

According to one embodiment, the read-only memory 26 is coupled to each of the row lines 24 only after each of the row lines 24 have passed completely through the memory array 20. In this manner, the row lines 24 are sequentially tested for the appropriate operation of the decode logic 22 and, additionally, each row line is simultaneously tested for continuity as it passes through the memory array 20. This added feature of this embodiment may be accomplished by organizing the memory system such that the read-only memory 26 is located opposite from the row decode logic 22 separated by the memory array 20.

Although the preferred embodiment has been described in detail, it should be understood that various changes, substitutions, and alterations can be made hereto without departing from the spirit and scope of the invention as defined by the appended claims.

What is claimed is:

1. A method of testing a memory circuit, comprising the steps of:
   sequentially activating each of a plurality of row address lines, each row address line coupled to a single row of memory locations within a first memory array of the memory circuit;
   storing a unique value associated with each of the row address lines in a read only memory array of the memory circuit, the row address lines also coupled to the read only memory array;
   sequentially outputting each of the unique values responsive to said step of sequentially activating the row address lines; and
   determining whether a correct value is output when each of the row address lines is activated.

2. The method of claim 1, wherein said sequentially outputting step includes selecting said read only memory array for outputting the unique value onto a data bus shaped by said first memory array and said read only memory array.

3. The method of claim 1, wherein said sequentially activating step includes activating one of the row address lines, and wherein said sequentially outputting step includes retrieving from the read only memory array, in response to activation of the one row address line, the unique value associated with the one row address line.

4. A memory circuit, comprising:
a first memory array comprising a plurality of first memory storage locations for storing data, said first memory array coupled to a plurality of row address lines;
a row decode address circuit coupled to said plurality of row address lines to receive an address and activate one of said plurality of row address lines in response to the address; and
a read only memory array coupled to said plurality of row address lines and comprising a plurality of second memory storage locations associated with and coupled, respectively, to each of said plurality of row address lines, each of said second memory storage locations storing a different predetermined value such that access to each of said second memory storage locations through said row address lines can be verified by successful retrieval of said predetermined values.

5. The circuit of claim 4, including a selection circuit coupled to said first memory array and said read only memory array to selection output an output from said first memory array or an output from said read only memory array in response to a selection control signal.

6. The circuit of claim 4 wherein said row address lines pass from said row address decode circuit through said first memory array to said read only memory array such that row address signals generated by said row address decode circuit must pass through said first memory array to reach said read only memory array.

7. The circuit of claim 5, wherein said selection circuit includes a multiplexer circuit coupled to outputs of said first memory array and said read only memory array.

8. The circuit of claim 4 wherein said first memory array comprises a non-volatile memory circuit.

9. A method for constructing a memory circuit, comprising the steps of:
forming a plurality of row address lines;
forming a first memory array coupled to the plurality of row address lines and comprising a plurality of first memory storage locations for storing data;
forming a row decode address circuit coupled to the plurality of row address lines to receive an address and activate one of the plurality of row address lines in response to the address; and
forming a read only memory array coupled to the plurality of row address lines and comprising a plurality of second memory storage locations associated with and coupled, respectively, to each of the plurality of row address lines, each of the second memory storage locations provided to store a different predetermined value such that access to each of the second memory storage locations through the row address lines can be verified by successful retrieval of said predetermined values.

10. The method of claim 9 wherein said step of forming a first memory array comprises the step of forming a non-volatile memory circuit.

11. The method of claim 9, including forming selection circuitry coupled to the first memory array and the read only memory array to select an output from the first memory array or an output from the read only memory array in response to a selection control signal.

12. The method of claim 11 wherein said step of forming selection circuitry comprises the step of forming a multiplexer circuit coupled to outputs of the first memory array and the read only memory array.

13. The method of claim 9 wherein said step of forming row address lines comprises the step of forming row address lines which pass from the row address decode circuit through the first memory array to the read only memory array such that row address signals generated by the row address decode circuit must pass through the first memory array to reach the read only memory array.

14. A memory circuit, comprising:
a non-volatile memory array comprising a plurality of first memory storage locations provided for storing data and coupled to a plurality of row address lines;
a row decode address circuit coupled to said plurality of row address lines to receive an address and activate one of said plurality of row address lines in response to said address;
a read only memory array coupled to said plurality of row address lines and comprising a plurality of second memory storage locations associated with and coupled, respectively, to each of said plurality of row address lines, each of said second memory storage locations storing data representing a difference predetermined value such that access to each of said second memory storage locations through said row address lines can be verified by successful retrieval of said predetermined values, said row address lines passing from said row address decode circuit through said non-volatile memory array to said read only memory array such that row address signals generated by said row address decode circuit must pass through said non-volatile memory array to reach said read only memory array;
first data output lines, coupled with said non-volatile memory array, to communicate data stored in said first memory storage locations within said non-volatile memory array when said first memory storage locations are selected by activating one of said row address lines associated with a particular set of said first memory storage locations;
second data output lines, coupled with said read only memory array, to communicate said predetermined values stored in said second memory storage locations within said read only memory array when said second memory storage locations are selected by activating one of said row address lines associated with a particular set of said second memory storage locations; and
multiplexer circuitry, coupled to said first and second data output lines and an output control signal, to output data communicated from said non-volatile memory array through said first data output lines or data communicated from said read only memory array through said second data output lines inn response to said output control signal.

* * * * *